United States Patent [19]

Bronner et al.

[11] Patent Number: 5,792,703

[45] Date of Patent: Aug. 11, 1998

[54] SELF-ALIGNED CONTACT WIRING PROCESS FOR SI DEVICES

[75] Inventors: Gary B. Bronner, Stormville, N.Y.; Jeffrey P. Gambino, Gaylordsville, Conn.

[73] Assignee: International Business Machines Corporation, Armonk, N.Y.

[21] Appl. No.: 619,047

[22] Filed: Mar. 20, 1996

[51] Int. Cl.$^6$ .................................................... H01L 21/28
[52] U.S. Cl. ........................ 438/620; 438/624; 438/637; 438/639
[58] Field of Search ........................ 438/586, 587, 438/595, 624, 637, 638, 639, 620, 622, 355, 363

[56] References Cited

U.S. PATENT DOCUMENTS

| | | | |
|---|---|---|---|
| 4,182,636 | 1/1980 | Dennard et al. | 148/187 |
| 4,409,722 | 10/1983 | Dockerty et al. | 29/571 |
| 4,713,356 | 12/1987 | Hiruta | 437/41 |
| 4,753,709 | 6/1988 | Welch et al. | 438/620 |
| 4,822,754 | 4/1989 | Lynch et al. | 437/193 |
| 5,292,678 | 3/1994 | Dhong et al. | 437/195 |
| 5,330,934 | 7/1994 | Shibata et al. | 437/195 |
| 5,372,956 | 12/1994 | Baldi | 437/34 |
| 5,378,654 | 1/1995 | Hsue | 437/195 |
| 5,525,530 | 6/1996 | Watabe | 438/586 |
| 5,550,071 | 8/1996 | Ryou | 438/586 |
| 5,591,659 | 1/1997 | Ema et al. | 437/52 |

FOREIGN PATENT DOCUMENTS 01-192137  8/1989  Japan .

OTHER PUBLICATIONS

J. Gambino, T. Ohiwa, D. Dobuzinsky, M. Armacost, S. Yoshikawa, B. Cunningham, A $S_i3N_4$ Etch Stop Stop Process For Borderles Contacts In 0.25 um Devices, 1995 VMIC Conference, Jun. 27–29 pp. 558–564.

Primary Examiner—John Niebling
Assistant Examiner—Thomas G. Bilodeou
Attorney, Agent, or Firm—Kris V. Srikrishnan

[57] ABSTRACT

A method of making electrical contacts to device regions in a substrate is taught. A first set of contacts are self-aligning and borderless and a second set of contacts are bordered. The method comprises the steps of providing a first insulating layer over the substrate and forming the first set of contacts in a self-aligned and borderless manner. This is followed by forming a second insulating layer over said first insulating layer, in which the second set of contacts that are bordered to the gate electrode and peripheral diffusions are formed through the first and second insulating layers. In addition, bordered contacts to the first set of borderless contacts are formed through the second insulating layer.

24 Claims, 5 Drawing Sheets

SELF-ALIGNED CONTACT WIRING PROCESS FOR SI DEVICES

FIELD OF INVENTION

The present invention relates to silicon device manufacturing and in particular to an improved method for forming contact wiring to devices.

BACKGROUND OF THE INVENTION

Silicon devices are continually being made smaller in order to increase device speed and circuit density. In device manufacturing, the tolerances from lithography and process determine how small a feature can be made reliably, and how close two adjacent features can be nominally formed. In general, many process steps are required to create or fabricate one level of a device. Since IC devices are sequentially built layers, the term level is used here in the sense of a particular layer, and includes the lithographic and non-lithographic process steps associated with forming the particular layer. Of the many levels involved in the building of an IC device, the earlier levels such as epitaxy, CVD, oxidation, diffusion and implantation are involved in the formation of the semiconductor device such as a transistor, and the follow-on levels create the thin film wiring or interconnection of adjacent devices and parts of the device to form electrical circuits. A lithographic mask is associated with most levels in device fabrication. A critical mask is one where the feature sizes and spaces are designed to the minimum capability of the available lithographic resolution and overlay abilities (tools and processes). A non-critical mask is one where feature sizes and spaces are larger than the minimum lithographic capability. The term pitch in design refers to the sum of feature width and spacing at a given level. Critical mask level processing usually involve extensive measurement and control, and often rework of the level, as the processes involved in forming the level have to be controlled tightly to achieve the desired feature sizes. Critical mask level processing results in higher manufacturing costs. Another process issue that is of importance is when a layer of non-critical images is followed by a layer of critical images. Since, features of the preceding layer electrically contacts the follow-on layer features, this leads to conflicts in design. For example, FIG. 1 shows a cross section wherein the contact studs $20a$, $20b$ are made to a larger width/spacing L.S, followed by metal lines $10a$, $10b$, $10c$ ... designed to a smaller size and spacing. This situation can lead to minimum spacings $x1$, $x2$ ... between the stud and wiring level and may not be acceptable from leakage or reliability consideration.

A contact wiring level is the transition from device to an interconnection, and often involves critical lithographic processing in order to achieve high wiring density. In FET devices, the gate electrode is usually made to minimum feature size and the source and drain contacts are separated by minimum spacing. U.S. Pat. Nos. 4,182,636 and 4,409,722 describe oxidizing polysilicon gate electrode so as to insulate and separate it from contacts to the source and drain without shorting. U.S. Pat. No. 5,378,654 teaches a process in which the gate electrode is capped with an oxide layer and insulating sidewall spacers formed along the side, enabling the contact metallization (polysilicon) to the diffusion to be self-aligned to the gate stack. That is, the diffusion contact is made borderless to the diffusion. The ability to self-align implies that a non-critical lithography can be used to define contacts to the diffusion. In advanced semiconductor memory and logic devices, it is preferred to make the contacts to diffusion of closely spaced devices by a borderless process, whereas the contact to the gate and contact to the diffusion of peripheral devices are made bordered. A bordered layout or design uses critical mask processing. FIG. 2A illustrate the concept of borderless contact, wherein contact $c2$ is free to be outside of the opening $c1$. FIG. 2B shows a bordered contact, i.e contact $c3$ is completely contained within $c1$. U.S. Pat. No. 5,372,956 teaches a double polysilicon process to make a buried contact to the diffusion and connect it to a gate or another polysilicon wire. U.S. Pat. No. 4,822,754 teaches capping the gate electrode and forming sidewall spacer, followed by depositing a thin polysilicon layer which makes contact to source and drain in a self-aligned manner. The polysilicon layer is photolithographically patterned to form source and drain contact with off-set capture pads. U.S. Pat. Nos. 5,292,678 and 5,330,934 also utilize sidewall spacer technique to improve reliability of contacts. Whereas the above patents teach making self-aligned contacts that use non-critical lithography, they fail to teach a process for forming critical and non-critical contacts when they are present in the same wafer level. None of the above teaching can be used to realize maximum wiring in advanced devices that are built to minimum feature capability of available lithography.

OBJECTS OF THE INVENTION

An object of the present invention is to provide a process for making electrical contact wiring to semiconductor devices.

Another object of the present invention is to form simultaneously critical contacts (set to minimum design features), while forming non-critical contacts (relaxed design) in a self-aligned manner.

A further object of the present invention is to enable formation of geometrically dissimilar contact studs by a simplified process.

A still further object of the present invention is to provide a low cost manufacturing process, usable on large substrates.

SUMMARY OF THE INVENTION

A method of making electrical contacts to device regions in a substrate is taught. A first set of contacts are self-aligning and borderless and a second set of contacts are bordered. The method comprises the steps of providing a first insulating layer over the substrate and forming the first set of contacts in a self-aligned and borderless manner. This is followed by forming a second insulating layer over said first insulating layer, in which the second set of contacts that are bordered to the gate electrode and peripheral diffusions are formed through the first and second insulating layers. In addition, bordered contacts to the first set of borderless contacts are formed through the second insulating layer.

BRIEF DESCRIPTION OF THE DRAWINGS

The objects, features and advantages of the present invention will be apparent from the following more particular description of the invention illustrated in the accompanying drawings, in which.

DETAILED DESCRIPTION OF THE INVENTION

Figure 1:
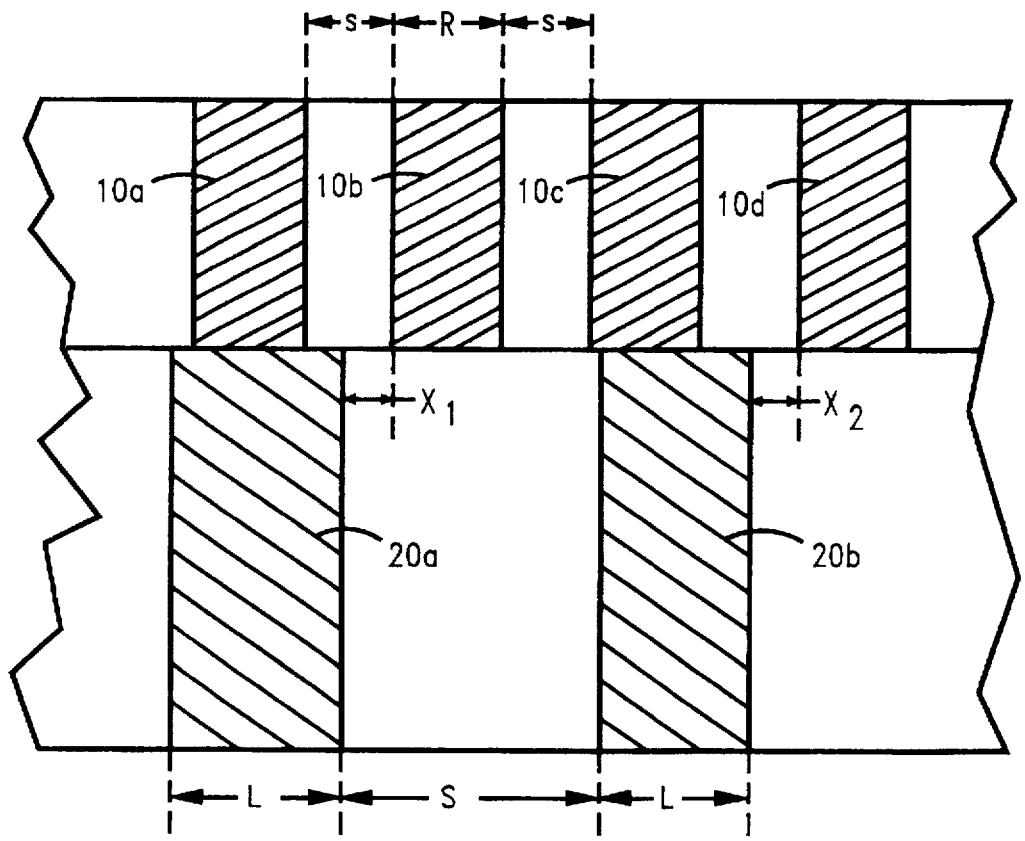
FIG. 1 is a cross sectional view showing a contact level of a looser pitch with a wiring level above to a tighter pitch.
Figure 2:
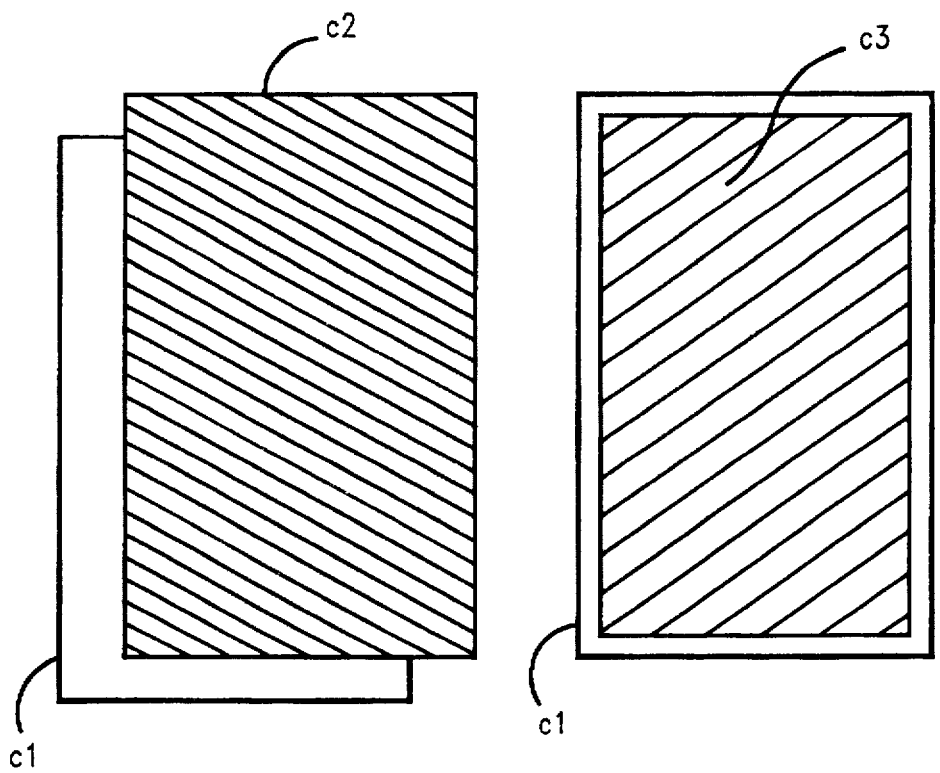
FIGS. 2A and 2B is a top down view of a contact showing a borderless and a bordered contact.
Figure 3:
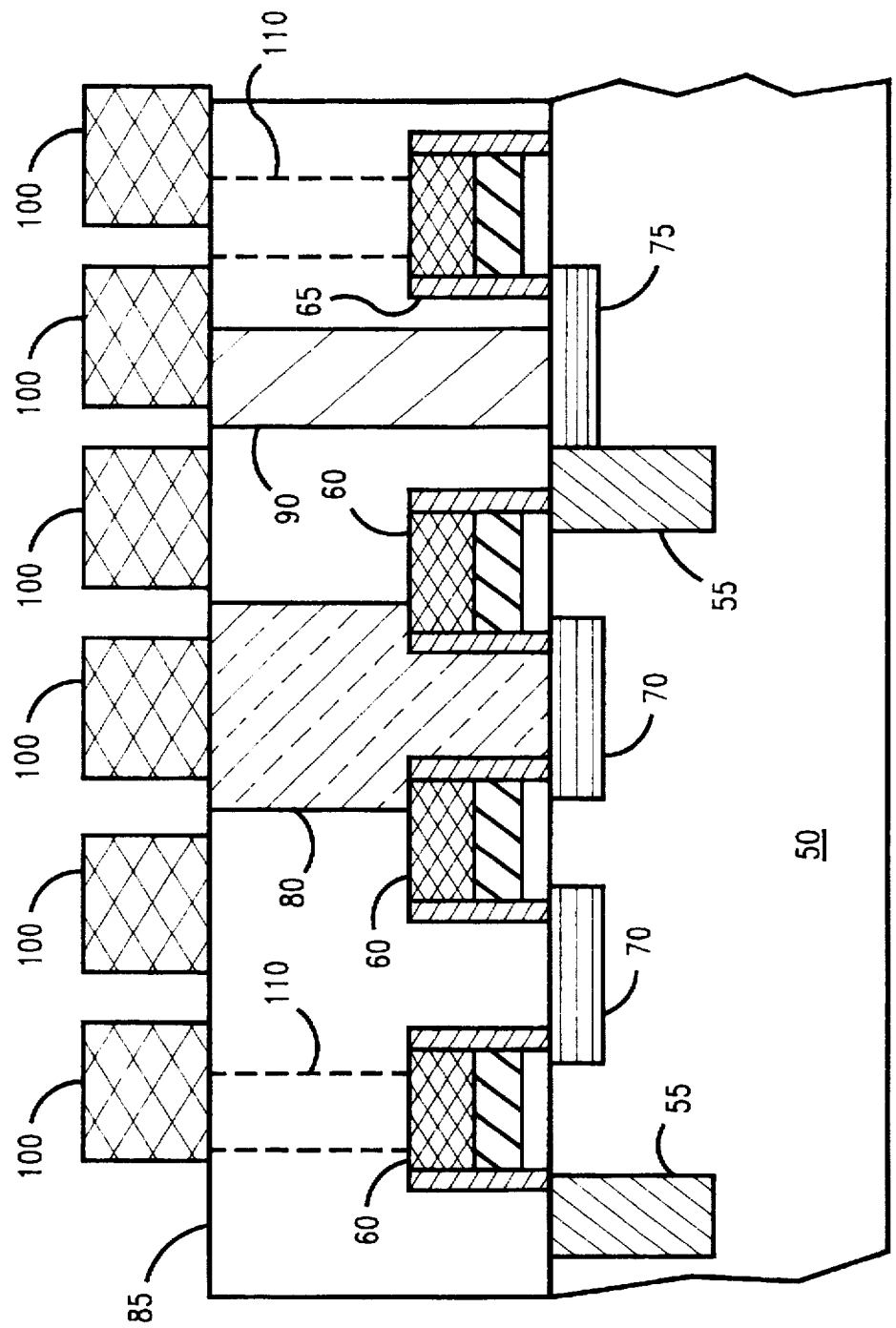
FIG. 3 is a cross section of a semiconductor device showing FET devices of minimum features (in an array) along with FET devices with large (relaxed) features in a periphery.

FIG. 3 is a cross sectional view of a silicon substrate 50 having a group of field effect transistors (FETs). FIG. 3 shows a group of closely spaced FETs as in an array region, with gate stacks 60 and diffusions 70, isolated by shallow trench 55. A group of periphery FET devices are also shown with gate stack 65 and diffusion 75. It can be readily seen that array devices have been designed with minimum gate stack width and minimum diffusion widths, whereas the periphery devices have larger diffusion widths. The gate stacks 60 and 65 shown are identical in their structure, having a polysilicon or silicide electrode totally encapsulated by an insulator material, capped with an insulator as well as having insulating sidewall spacers. The insulator commonly used to cap gate electrode is one or combination of TEOS silicon dioxide, thermal silicon dioxide or silicon nitride. Other insulators such boron nitride, aluminum oxide, silicon oxynitride can also be used. The process details for forming such a gate electrode is known and will not be described herein. An insulating layer 85 is deposited over the device surface and is shown in FIG. 3 as a planarized layer. In a commonly used process, contact openings (or vias) are etched using a first mask in layer 85 (usually PECVD oxide), terminating on the diffusion regions. The reactive ion etch process is selective to the gate stack insulator, which is typically chosen as silicon nitride. In principle, the contacts 80 to the diffusion regions 70, are made larger than minimum lithography feature as they are self-aligned to gate stack 60 or STI 55. However, as shown in FIG. 1, and discussed in the background section, these images have to be controlled critically, as they conflict with subsequent metal lines 100 which is formed to minimum feature width and spacing. Consequently the diffusion contacts, even though self-aligned, requires a critical masking level. A second critical masking level is used to etch openings 110 to the gate and 90 to the peripheral diffusions using bordered contacts. Since two critical masks are involved, the contact stud process is very expensive. In contrast, the process taught in-here requires only one critical masking. The inventive concepts are better illustrated by using the example of FIG. 3, making contacts to a FET device.

Figure 4:
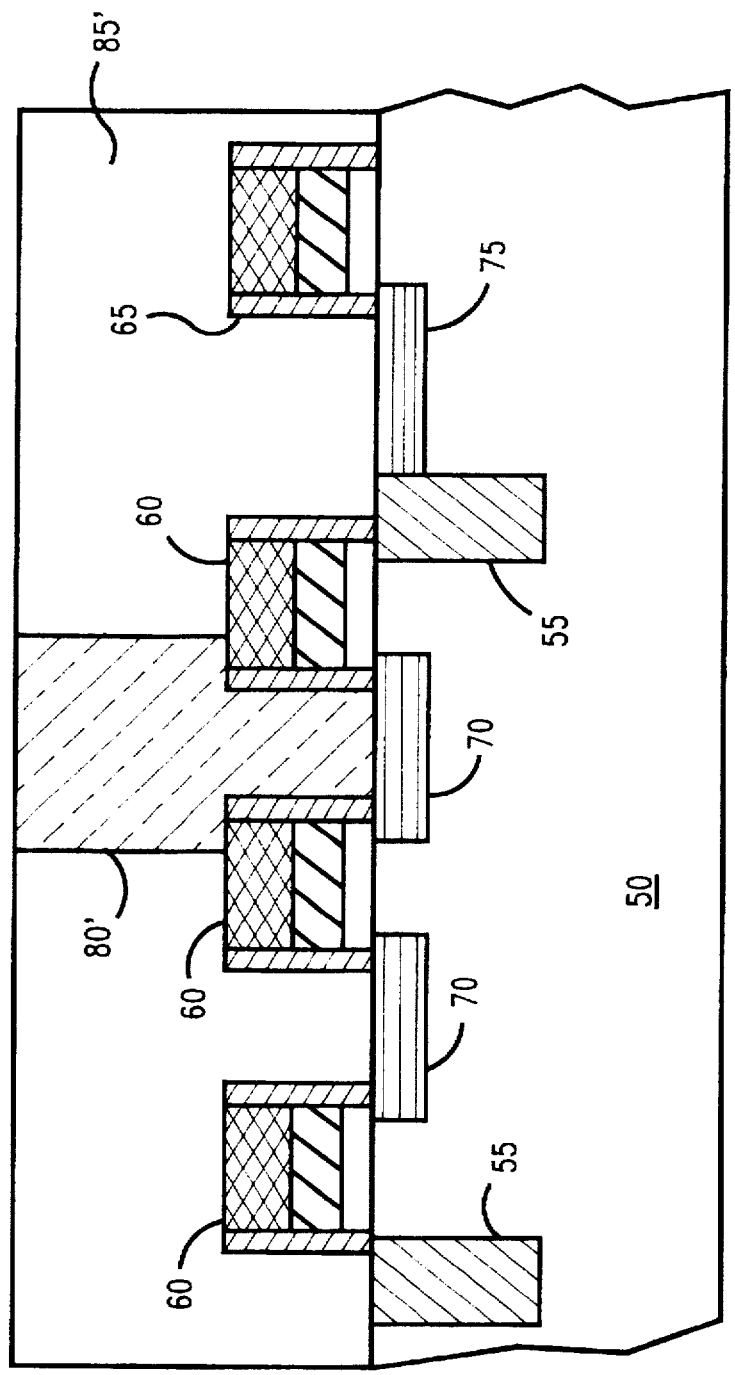
FIGS. 4 and 5 shows an embodiment of the present invention of forming contact studs and metal lines for the same device shown in FIG. 3.
Figure 5:
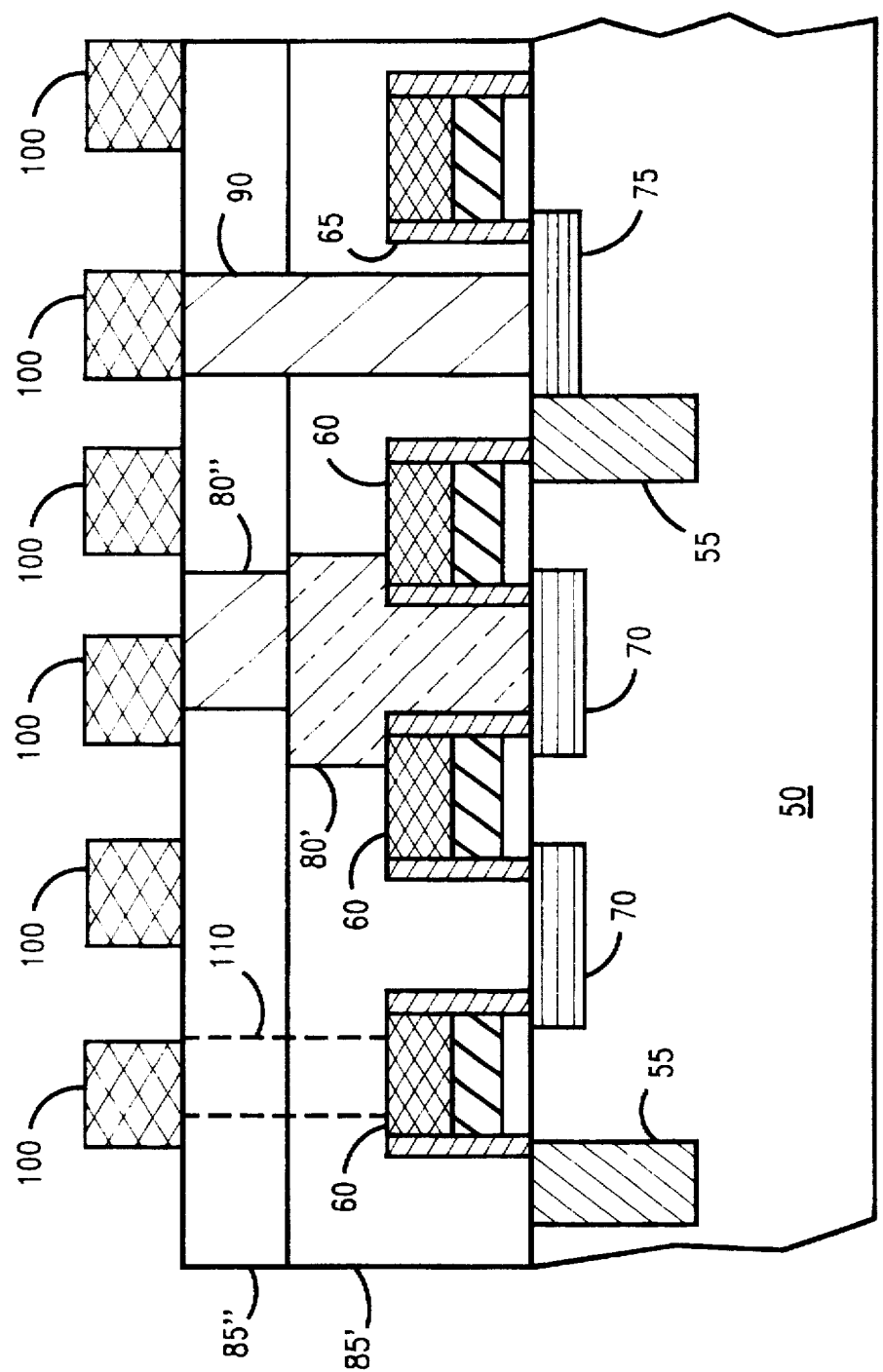

FIGS. 4 and 5 show sequential processing of substrate 50 so as to achieve the contact structure of FIG. 3. Referring to FIG. 4, isolation regions 55, gate stacks 60,65 and diffusion regions 70,75 are defined in a substrate 50 using known processes. A layer of insulator 85' is deposited over the substrate and preferably planarized. The insulator is selected from a group of materials such as spin on glass, boron and phosphorus doped silicon dioxide, etc. that have intrinsically good etch rates and have the desired insulating properties for use adjacent to devices. The thickness of the planarized insulator is less than the thickness of layer 85 in FIG. 3, and is typically in the range of 0.5 to 1.2 microns. Using known photolithographic process, non-critical openings are etched into the insulator 85' so as to create openings such as 80'. The image size of 80' is substantially larger than the diffusion contact opening in the case of narrowly spaced gate stacks. The hole opening process etches the insulator highly selective to the insulating layer capping the gate stack so that the contacts are self-aligning in nature. The insulating layer capping the gate electrode is usually one that has a lower etching rate compared to layer 85'. For this capping layer, silicon nitride, aluminum oxide, silicon oxynitride, diamond, boron nitride, fluorinated oxide or nitride and alike are suitable. The self-aligning feature, as explained earlier, is simply that the opening 80' being larger than the diffusion contact allows the contact metallization in 80' to fully contact the diffusion in a self-aligned manner. The contact opening 80' is filled with a conductor, such as polysilicon, tungsten, molybdenum, aluminum alloys or metallic silicides such as tungsten silicide, tantalum silicide, molybdenum silicide, or silicides of titanium, cobalt, platinum or palladium. In some applications, the contact forming process steps, can be used to form local interconnect wiring simultaneously, such as diffusion to diffusion etc. Depending on the diffusion size in the peripheral regions, larger openings can be etched at this time, the only restriction being that the imaging not be critical. Amidst the choice for the insulating layer 85', PSG or BPSG glasses are preferred as they are also an effective ionic barrier. Further, these doped oxides etch faster with respect to silicon nitride cap layer. When silicon nitride liner is used over gate stack, an etch process using $C_4F_8$:CO gas mixture can be used to achieve high selectivity etching of silicon dioxide to silicon nitride as taught by Gambino et al., in "A $Si_3N_4$ Etch Stop Process For Borderless Contacts in 0.25 um Devices", 1995 VMIC Conference, pp558-564. The connecting stud 80' can be formed by deposition of the conductor layer followed by etchback or chemical mechanical polish, which are well known in the art. When local wiring is desired, it can also be patterned using lithographic techniques.

Now, referring to FIG. 5, a second insulating layer 85" is deposited over the finished structure of FIG. 4. The insulator layer 85" will be planar as deposited and at worst may require a minimum touch up planarization. The insulator 85" can be undoped silicon dioxide, silicon nitride, B and P doped glasses and other similar insulating materials. It could also be one of spin-on-glasses or organic insulators. Now using critical photolithography, contact holes at the minimum feature size are etched into layer 85' and 85" such that the contact hole 110 are bordered with respect to gate stack, contacts 90 are bordered with respect to the peripheral diffusions 75 and contacts 80" are bordered with respect to contacts 80'. The etch process used in forming openings for this step, is not required to be selective to the cap insulator of the gate stack. Thus a method has been conceived that avoids the use of two mask levels having critical lithography. The conductors 80", 90 and 110 are preferably chosen from polysilicon, tungsten, molybdenum, aluminum alloys, copper alloys, silicides and alike. These second set of contacts can be formed by overfilling the opening and removing the conductor outside of the opening by etch back or chemical mechanical planarization. If desired, the same process steps can also be used for local interconnection. In all cases, suitable diffusion barriers and or nucleating layers will be used as required for the selected conductor. The second insulating layer 85" is preferably PSG or BPSG (B,P doped glass).

While the invention has been described in terms of a single preferred embodiment, various alternatives and modifications can be devised by those skilled in the art without departing from the invention. Accordingly, the present invention is intended to embrace all such alternatives which fall within the scope of the appended claims.

What is claimed is:

1. A method of making electrical contact studs to a plurality of first and second device regions and isolation regions contained in a substrate, comprising the steps of:
   - forming a first insulator over said substrate;

-forming a first set of contact studs through said first insulator self-aligned and borderless to the first device regions;

-forming a second insulator over said first insulator including said first set of contact studs; and, -forming a second set of contact studs through said first and second insulators bordered to the second device regions.

2. The method of claim 1, wherein said substrate is a silicon substrate.

3. The method of claim 1, wherein said first device regions include diffusion regions designed to a minimum width and said second device regions include gate electrodes and diffusion regions designed to larger than minimum width.

4. The method of claim 3, wherein said gate electrodes comprise a cap layer selected from the group consisting of silicon nitride, aluminum oxide, undoped silicon dioxide, silicon oxynitride, diamond, boron nitride and fluorinated silicon dioxide.

5. The method of claim 1, wherein said first insulator is selected from the group consisting of B and P doped glasses.

6. The method of claim 1, wherein said second insulator is selected from the group consisting of undoped silicon dioxide, silicon nitride and B and P doped glasses.

7. The method of claim 1, wherein said first set of contact studs is selected from the group consisting of tungsten, polysilicon, molybdenum, metallic silicides and aluminum alloys.

8. The method of claim 1, wherein said second set of contact studs is selected from a group consisting of tungsten, polysilicon, aluminum alloys and copper alloys.

9. The method of claim 1, wherein said step of forming the first insulator comprises the steps of:

- depositing a first layer of insulator over the substrate; and,

- planarizing the first insulating layer.

10. The method of claim 1, wherein said step of forming the second insulator comprises the steps of:

- depositing a second layer of insulator over the first insulator; and

- planarizing the second insulating layer.

11. The method of claim 1, wherein said step of forming the first set of contact studs, comprises the steps of:

-forming a plurality of openings in the first insulator borderless and self-aligned to the first device regions;

-depositing a first conductor in said openings so as to make electrical contact to said first device regions; and, -removing the first conductor from unwanted areas.

12. The method of claim 1, wherein said step of forming the second set of contact studs, comprises the steps of:

-forming a plurality of bordered openings in the first and second insulator to said second device regions;

-depositing a second conductor in said openings so as to make electrical contact to said second device regions; and, -removing the second conductor from unwanted areas.

13. A method of making electrical contact(s) studs to at least two isolated FET devices in a silicon substrate, with one having a first diffusion regions designed to a minimum width and other having a second diffusion regions designed to larger than minimum width, comprising the steps of:

-forming a first insulator over the substrate;

-forming a first set of contact studs self-aligned and borderless to the first diffusion regions through the first insulator;

-forming a second insulator over the first insulator including the first set of contact studs; and, -forming a second set of contact studs through the first and second insulators bordered to the second diffusion regions.

14. The method of claim 13, wherein said gate electrode comprises a cap layer selected from the group consisting of silicon nitride, aluminum oxide, undoped silicon dioxide, silicon oxynitride, diamond, boron nitride and fluorinated silicon dioxide.

15. The method of claim 13, wherein said first insulator is selected from the group consisting of B and P doped glasses.

16. The method of claim 13, wherein said second insulator is selected from the group consisting of undoped silicon dioxide, silicon nitride, and B and P doped glasses.

17. The method of claim 13, wherein said first set of contact studs is selected from the group consisting of tungsten, polysilicon, metallic silicides and aluminum alloys.

18. The method of claim 13, wherein said second set of contact studs is selected from the group consisting of tungsten, polysilicon, aluminum alloys and copper alloys.

19. The method of claim 13, wherein said step of forming the first insulator comprises the steps of:

- depositing a first layer of insulator over the substrate; and,

- planarizing the first insulating layer.

20. The method of claim 13, wherein said step of forming the second insulator comprises the steps of:

-depositing a second layer of insulator over the first insulator including the first set of contact studs; and, -planarizing the second insulating layer.

21. The method of claim 13, wherein said step of forming the first set of contact studs, comprises the steps of:

-forming a plurality of openings in the first insulator borderless and self-aligned to the first diffusion regions;

-depositing a first conductor in said openings so as to make electrical contact to said first diffusion regions; and, -removing the first conductor from unwanted areas.

22. The method of claim 13, wherein said step of forming the second set of contact studs, comprises the steps of:

-forming a plurality of bordered openings in the first and second insulator to said second diffusion regions;

-depositing a second conductor in said openings so as to make electrical contacts to said second diffusion regions; and, -removing the second conductor from unwanted areas.

23. The method of claim 1 further comprising the step of forming a third set of contact studs through the second insulator to the first set of contact studs.

24. The method of claim 13 further comprising the step of forming a third set of contact studs through the second insulator to the first set of contact studs.

* * * * *